US006961279B2

(12) United States Patent
Simko

(10) Patent No.: US 6,961,279 B2
(45) Date of Patent: Nov. 1, 2005

(54) FLOATING GATE NONVOLATILE MEMORY CIRCUITS AND METHODS

(75) Inventor: Richard T. Simko, Los Altos Hills, CA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 10/798,547

(22) Filed: Mar. 10, 2004

(65) Prior Publication Data

US 2005/0201179 A1   Sep. 15, 2005

(51) Int. Cl.[7] .............................................. G11C 7/00
(52) U.S. Cl. ............ 365/226; 365/185.01; 365/185.09; 365/185.14; 365/185.26; 365/185.29
(58) Field of Search ........................ 365/226, 185.01, 365/185.14, 185.29, 185.26, 185.09

(56) References Cited

U.S. PATENT DOCUMENTS

| 3,984,822 | A | 10/1976 | Simko et al. |
|---|---|---|---|
| 3,996,657 | A | 12/1976 | Simko et al. |
| 4,053,349 | A | 10/1977 | Simko |
| 4,099,196 | A | 7/1978 | Simko |
| 4,119,995 | A | 10/1978 | Simko |
| 4,203,158 | A | 5/1980 | Frohman-Bentchkowsky et al. |
| 4,263,664 | A | 4/1981 | Owen et al. |
| 4,274,012 | A | 6/1981 | Simko |
| 4,300,212 | A | 11/1981 | Simko |
| 4,314,265 | A | 2/1982 | Simko |
| 4,393,481 | A | 7/1983 | Owen et al. |
| 4,404,475 | A | 9/1983 | Drori et al. |
| 4,486,769 | A | 12/1984 | Simko |
| 4,488,060 | A | 12/1984 | Simko |
| 4,511,811 | A | 4/1985 | Gupta |
| 4,520,461 | A | 5/1985 | Simko |
| 4,533,846 | A | 8/1985 | Simko |
| 4,617,652 | A | 10/1986 | Simko |
| 4,890,259 | A | 12/1989 | Simko |
| 4,989,179 | A | 1/1991 | Simko |
| 5,126,967 | A | 6/1992 | Simko |
| 5,220,531 | A | 6/1993 | Blyth et al. |
| 5,241,494 | A | 8/1993 | Blyth et al. |
| 5,294,819 | A | 3/1994 | Simko |
| 5,677,874 | A | * 10/1997 | Yamano ................. 365/185.18 |
| 5,723,985 | A | 3/1998 | Van Tran et al. |
| 5,969,987 | A | 10/1999 | Blyth et al. |
| 5,973,956 | A | 10/1999 | Blyth et al. |
| 6,366,519 | B1 | * 4/2002 | Hung et al. .................. 365/226 |
| 6,538,922 | B1 | 3/2003 | Khalid et al. |
| 2003/0112661 | A1 | 6/2003 | Khalid et al. |

OTHER PUBLICATIONS

"Fowler-Nordheim Emmision from Texture Surface Features," in *Nonvolatile Semiconductor Memory Technology*, William D. Brown & Joe E. Brewer eds., IEEE press, p. 163 (1998).

(Continued)

*Primary Examiner*—Anh Phung
*Assistant Examiner*—Pho M. Luu
(74) *Attorney, Agent, or Firm*—Townsend and Townsend and Crew LLP

(57) ABSTRACT

A non-volatile memory element is operated, in part, in two phases. During the first phase, a voltage is applied to a first node coupled to the nonvolatile memory element to generate an initial voltage. During the second phase, a voltage is coupled through at least one capacitor to charge pump the initial voltage to a level sufficient for programming or erasing the non-volatile memory element.

24 Claims, 14 Drawing Sheets

OTHER PUBLICATIONS

"MOS Processing," in *MOS Integrated Circuits: Theory, Fabrication, Design and Systems Applications of MOS LSI* by staff of American Micro Systems Inc., pp. 174-183, (1972).

Blyth et al. "Non-Volatile Analog Storage Device Using EEPROM Technology," Digest of Technical Papers 38th IEEE International Solid-State Circuits Conference, pp. 192-315 (1991).

Chang et al. "A Low Voltage, Low Power P-Channel EEPROM Cell for Embedded and System-On-A-Chip Applications," Programmable Microelectronics Corp., San Jose, CA (1998).

Drori et al. " A Single 5V Supply Nonvolatile Static RAM," Digest of Technical Papers the 1981 IEEE International Solid-State Circuits Conference, pp. 148-149 (1981).

Drori et al. "Computer systems acquire both RAM and $E^2$Prom from one chip with two memories," Electronic Design 28:91-95 (1980).

Gerber et al. "Low Voltage Single Supply CMOS Electrically Erasable Read-Only Memory," IEEE Transactions on Electron Devices 27:1211-1216 (1980).

Harari et al. "A 256-bit Nonvolatile Static RAM," IEEE International Solid-State Circuits Conference Digest of Technical Papers pp. 108-109 (1978).

Jewell-Larsen et al. "5-Volt Ram-Like Triple Polysilicon $E^2$Prom," IEEE Conference proceedings Second Annual Phoenix Conference on Computers and Communication, pp. 508-511 (1983).

Klein et al. "5-volt-only, nonvolatile RAM owes it all to polysilican," Electronics 52:111-116 (1979).

Salsbury et al. " High-Performance MOS EPROM's Using a Stacked Gate Cell," Digest of Technical Papers the 1977 IEEE International Solid-State Circuits Conference, pp. 186-187 (1977).

\* cited by examiner

FLOATING GATE NONVOLATILE MEMORY CIRCUITS AND METHODS

BACKGROUND

The present invention relates to nonvolatile memories. More particularly, the present invention relates to floating gate nonvolatile memory circuits and methods.

Generally, memory circuits are used to store information in an electronic system. Typically, information is stored as binary data (e.g., 0's and 1's) represented in the system as binary values of voltages or currents. While many semiconductor memory architectures exist, they generally can be categorized as volatile and nonvolatile. Volatile memories are those memories that require a periodic refresh of the data values stored electronically in the memory. One example of a volatile memory is a dynamic random access memory, wherein data may be stored as a voltage on a capacitor. However, because the voltage on the capacitor may dissipate over time, such memories require a periodic refresh, wherein the voltage on the capacitor is refreshed to its nominal value. Additionally, all the information stored in such memories is typically lost when a power source is removed from the system. Nonvolatile memories, on the other hand, include all forms of solid state memory that do not need to have their memory contents periodically refreshed. This includes all forms of programmable read-only memory (PROM), erasable programmable read-only memory (EPROM), electrically erasable programmable read-only memory (EEPROM), and flash memory.

Nonvolatile memory circuits are advantageous over volatile memory circuits because they have the ability to store data without the need for a constant source of power. Many nonvolatile memories take advantage of various electrical phenomena to move electrons to and from an isolated conductor. The isolated conductor is often referred to as a floating gate. When the electrons are moved to the isolated conductor, the voltage on the conductor decreases, and when the electrons are moved from the isolated conductor, the voltage on the conductor increases. The change in voltage may be used as a binary representation of data. Therefore, the voltage changes may be detected and the data values they represent may be used to control other electronic circuits in the system.

However, one problem with existing nonvolatile memories is the relatively large voltages that must be generated in order to move electrons to and from the isolated conductor. Electronic circuits typically have a nominal power supply voltage, and if the voltage required for operating a nonvolatile memory element exceeds the nominal supply voltage, a variety of problems can occur. One immediately evident problem is the large voltages may exceed the breakdown voltages of other devices in the system. Another problem pertains to the complexity of the circuitry required for generating the high voltages.

Yet another problem with existing nonvolatile memories is the cost and complexity of the processes that must be used to implement such memories. Existing nonvolatile memories may require very complicated semiconductor processing techniques with many process steps. However, as the semiconductor process becomes more complicated, the cost of the process tends to increase. Additionally, complicated processes also tend to result in lower yields (i.e., higher defect rates), thereby reducing the profitability of any circuits manufactured on the process.

Therefore, what is needed are more effective circuits and methods for implementing nonvolatile memories.

SUMMARY

The present invention includes innovative circuits and methods for implementing nonvolatile memories. In one embodiment, the present invention includes a method of operating a nonvolatile memory wherein, during a first time period, a first voltage is coupled to a first terminal of a nonvolatile memory element and a second voltage is coupled to a second terminal of the nonvolatile memory element, wherein the first voltage is greater than the second voltage, and during a second time period, a third voltage is coupled through at least one capacitor to the first terminal, the third voltage further increasing the voltage on the first terminal so that electrons flow to or from a floating gate in said nonvolatile memory element.

In another embodiment, the present invention includes a nonvolatile memory element having at least first and second terminals, a voltage source coupled to at least one terminal to provide a first voltage during a first time period, said first voltage being less than the voltage required to for electrons to flow to or from a floating gate of the nonvolatile memory element, and a charge pump circuit coupled to said at least one terminal, the charge pump circuit including at least one capacitor that receives a second voltage during a second time period, and in accordance therewith, further increases the voltage on said terminal so that electrons flow to or from the floating gate of the nonvolatile memory element.

In another embodiment the present invention includes a nonvolatile memory comprising a nonvolatile memory element having at least first and second terminals and a floating gate, and one or more capacitors coupled in series to the first terminal, wherein during a first time period, a first voltage is coupled to the first terminal and a second voltage is coupled to the second terminal, the first voltage being greater than the second voltage, and during a second time period following the first time period, a third voltage is coupled through at least one of the capacitors to the first terminal, the third voltage further increasing the voltage on the first terminal so that electrons flow to or from the floating gate.

The following detailed description and the accompanying drawings provide a better understanding of the nature and advantages of the present invention.

DETAILED DESCRIPTION

The present invention provides a number of techniques that may be used to in nonvolatile memories that result in improvements over the prior art. The nonvolatile memory techniques disclosed herein include circuit designs, methods, and processes. Those skilled in the art will understand that these innovations can be used alone or in combination with one another, and may further be used in combination with existing techniques, to create improved nonvolatile memories. Thus, this detailed description is to be read as illustrative of exemplary embodiments of the various innovations described herein.

Figure 1:
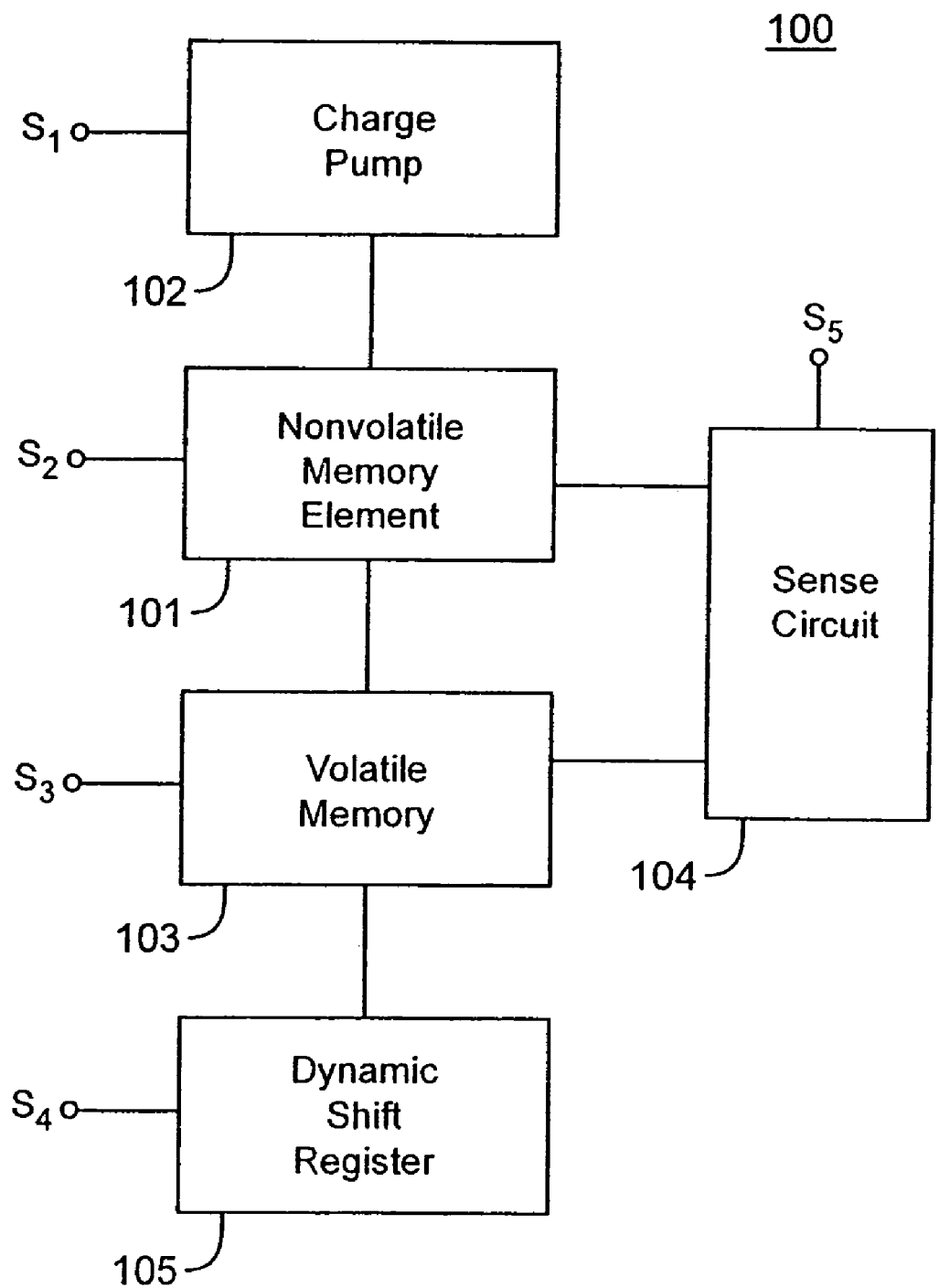
FIG. 1 illustrates a nonvolatile memory architecture according to one embodiment of the present invention.

FIG. 1 illustrates an example of a nonvolatile memory architecture according to one embodiment of the present invention. Nonvolatile memory 100 includes a nonvolatile memory element 101 for storing data. In some embodiments, a charge pump 102 may be used to generate the voltages necessary for storing data in the nonvolatile memory element as described in more detail below. Embodiments of the present invention may also use a volatile memory element 103, such as a latch, together with the nonvolatile memory element 101. These memories are referred to as NOVRAMs or nonvolatile random access memories. Embodiments of the present invention include innovative ways of combining nonvolatile memory elements and volatile memory elements such as latches. For example, in one embodiment an innovative sense circuit 104 receives electrical input from the nonvolatile memory element 101 and sets the data values in a volatile memory element. In another embodiment, the present invention provides an innovative technique for using volatile memory element 103 to program or erase the data values in nonvolatile memory element 101. In another embodiment, the data in volatile memory element 103 may be loaded or unloaded using an innovative dynamic shift register 105. The nonvolatile memory element 101, charge pump 102, volatile memory element 103, sense circuit 104, and/or dynamic shift register 105 may receive voltage and control signals on signal lines $S_1$–$S_5$. These signals may be in the form of voltages or currents, and are used to control the operation of the circuits. Embodiments of the present invention may also advantageously be implemented on a simple integrated circuit process. It is to be understood that embodiments of the present invention may include some or all of these features, the details of which are described in more detail below.

Figure 2:
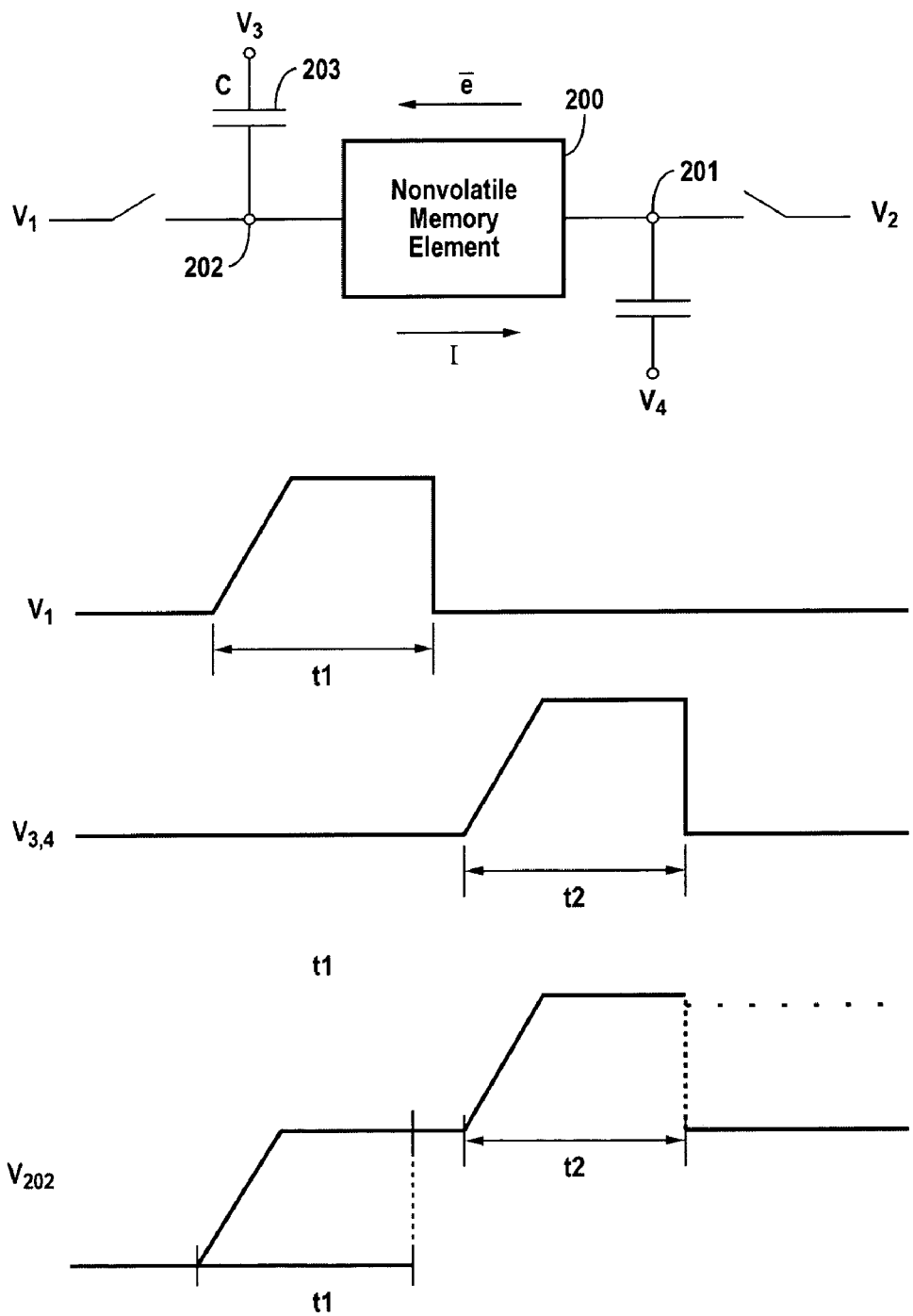
FIG. 2 illustrates the two-phase operation of a nonvolatile memory according to one aspect of the present invention.

FIG. 2 illustrates the two-phase operation of a nonvolatile memory according to one aspect of the present invention. In one embodiment, two-phase operation is combined with a charge pumping technique to perform both PROGRAM and ERASE operations. In FIG. 2, a nonvolatile memory element 200 is shown. Nonvolatile memory element 200 includes two terminals 201–202. Data is typically stored on a floating gate internal to the nonvolatile memory element as a voltage. In order to modify the voltage on the floating gate, and control the data value stored thereon, it is necessary to create the correct electrical conditions that will allow electrons to flow onto and off of the floating gate. Proper electrical conditions for allowing electrons to move to and from the floating gate typically include generating a large voltage between the floating gate and at least one other terminal on the memory element. However, typical CMOS circuits operate between voltages of 0–5 volts or lower, whereas voltages as high as 15–20 volts or more may be required to move electrons back and forth between the terminals of a nonvolatile memory element. Thus, the high voltages associated with nonvolatile memories can be problematic because such voltages may exceed the breakdown voltage of other devices in the system.

For the purposes of discussion, an operation that removes electrons from the floating gate will be discussed. This is referred to herein as an ERASE operation. However, other naming conventions could be used. During a first time period, voltage $V_1$ is coupled to terminal 202 and a second voltage $V_2$ is coupled to terminal 201 (e.g., terminal 201 may be set to a low voltage close to ground). At the beginning of the first time period, t1, $V_1$ is increased, causing the voltage on terminal 202 to increase. At the end of the first time period, $V_1$ is disconnected from terminal 202 (e.g., $V_1$ may be set to a high impedance or equivalent technique), and $V_1$ may be set back to its original value. The voltage on terminal 202 remains substantially fixed because the charge is now isolated. At the beginning of the second time period, t2, a voltage $V_3$ is coupled to terminal 202 through capacitor 203. As $V_3$ increases, the voltage on terminal 202 is further increased (i.e., it is "pumped up") by capacitor 203. When the voltage difference between terminal 202 and 201 is sufficiently large, the electrical conditions will allow electrons to move from the internal floating gate to terminal 202, resulting in a net voltage increase on the internal floating gate. Those skilled in the art will understand that the current, I, will flow in the opposite direction as the electrons. A similar procedure using $V_2$ and $V_4$ may be used to move electrons from terminal 202 to the internal floating gate, resulting in a net voltage decrease on the internal floating gate.

Figure 3:
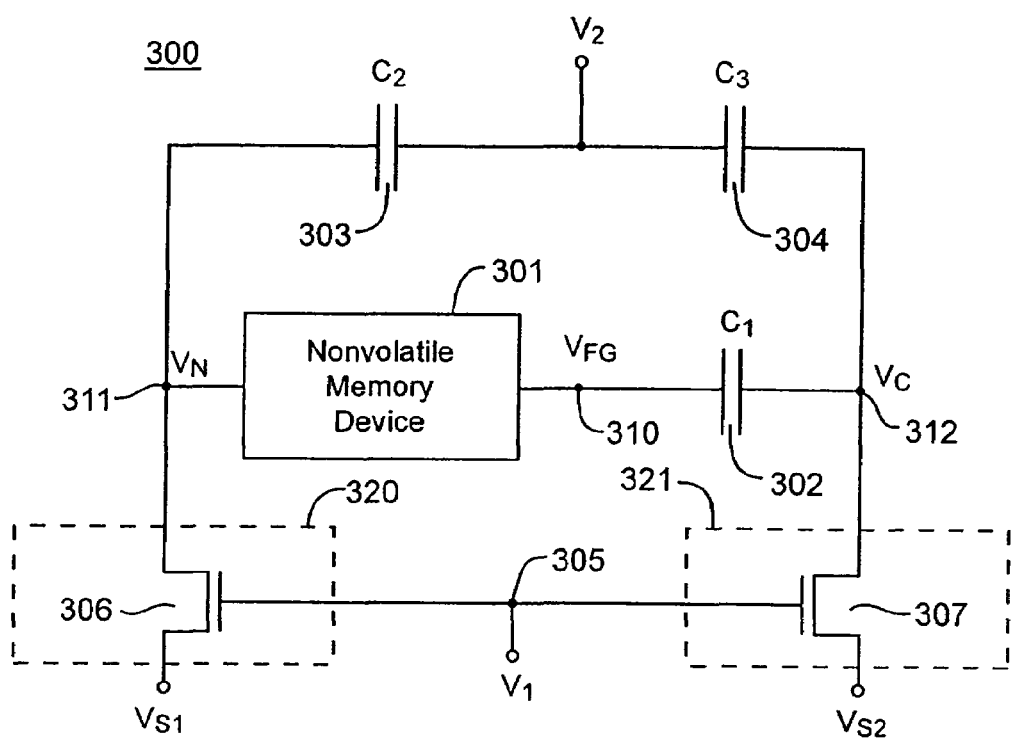
FIG. 3 illustrates the implementation of a nonvolatile memory circuit according to one embodiment of the present invention.

FIG. 3 illustrates a nonvolatile memory circuit 300 according to one embodiment of the present invention. Nonvolatile memory circuit 300 includes a nonvolatile memory device 301 having at least two terminals, one of which is a floating gate terminal 310. Floating gate terminal 310 is connected to one plate of capacitor ("C1") 302. The other terminal 311 of nonvolatile memory element 301 is connected to one plate of a second capacitor ("C2") 303 and a voltage source 320. In this example, voltage source 320 is comprised of NMOS transistor 306 having source connected to voltage source $V_{S1}$ and gate connected to voltage source $V_1$. The second plate of capacitor 303 is connected to voltage source $V_2$ and to one plate of capacitor ("C3") 304. The second plate of capacitor 304 is connected to the second plate of capacitor 302 and to another voltage source 321, which in this example is similarly comprised of NMOS transistor 307 having source connected to a voltage source $V_{S2}$ and a gate connected to voltage source $V_1$.

Floating gate voltage $V_{FG}$ may be controlled by controlling the flow of electrons to and from the floating gate terminal 310 through nonvolatile memory device 301. To achieve electron flow, the voltage across nonvolatile memory device 301 is typically increased to a sufficient level so that the electrical properties of the device allow electrons to pass between floating gate terminal 310 and terminal 311. Appreciable electron flow from terminal 311 to floating gate 310 typically occurs when the floating gate voltage $V_{FG}$ is more positive than the voltage $V_N$ on terminal 311 by some "threshold" voltage of the device. This scenario results in a negatively charged floating gate, and is referred to herein as a "PROGRAMMING" operation. Similarly, electrons are typically removed from floating gate 310 when the voltage on terminal 311 is sufficiently more positive than the floating gate voltage $V_{FG}$. This results in a positively charged floating gate, and is referred to herein as an "ERASE" operation. It is to be understood that the detailed mechanisms of electron flow, including the exact voltages necessary for appreciable electron movement, will be different depending on the particular type of nonvolatile memory device utilized.

Embodiments of the present invention operate circuit 300 in two-phases to PROGRAM and ERASE memory device 301. To perform an ERASE, a voltage source coupled to terminal 311 (e.g., transistor 306, $V_1$, and $V_{S1}$) may raise the voltage, $V_N$, on terminal 311 to a first intermediate voltage substantially equal to $V_{S1}$ during a first time period (i.e., a first phase). The voltage on terminal 312, $V_C$, is maintained at a lower voltage than terminal 311 (e.g., zero volts or ground). In this example, $V_N$ can be set to the intermediate voltage and Vc can be set to zero volts simultaneously by the action of $V_1$, if $V_1$ is sufficiently greater than $V_{S1}$, and $V_{S2}$ is ground, where transistor 306 is operating as a source follower and transistor 307 operates as a pass gate. Thus, the voltage appearing across nonvolatile memory device 301 is set by the capacitive divider according to the following equation:

$$V_{NVMEM} = (V_N - V_{FG})$$

$$V_{NVMEM} = V_N(C1/C1 + C_{NVM})$$

Where $V_{NVMEM}$ and $C_{NVM}$ are the voltage and capacitance across with the nonvolatile memory device 301, respectively, and C1 is typically much larger than $C_{NVM}$ (e.g., 2×–4×). At the end of the first phase, voltage source 320 is set to a high impedance and the voltage $V_N$ remains at the intermediate voltage (essentially $V_{S1}$). Next, during a second time period (i.e., a second phase), voltage source $V_2$ provides a voltage to capacitor C2, thereby further increasing the voltage on the terminal 311. Thus, the voltage applied during the first phase is "pumped up" during the second phase by $V_2$ and the action of capacitors C1, C2, and any intrinsic capacitance of nonvolatile memory element 301. When the voltage on terminal 311 increases to a sufficient level, electrons can pass from the floating gate of memory element 301 to terminal 311.

A PROGRAMMING operation works in a similar fashion. To perform a PROGRAMMING operation, voltage source 321 (e.g., transistor 307, $V_1$, and $V_{S2}$) may raise the voltage on terminal 312 to a first intermediate voltage substantially equal to $V_{S2}$ during a first time period (i.e., a first phase). In this case, the voltage on terminal 311, $V_N$, is maintained at a lower voltage than terminal 312 (e.g., zero volts or ground). Thus, the voltage appearing across nonvolatile memory device 301 is set by the capacitive divider according to the following equation:

$$V_{NVMEM} = V_{FG}$$

$$V_{NVMEM} = V_C(C1/C1 + C_{NVM})$$

At the end of the first phase, voltage source 321 is set to a high impedance and the voltage $V_C$ remains at the intermediate voltage. Next, during a second time period (i.e., a second phase), voltage source $V_2$ provides a voltage to capacitor C3, thereby further increasing the voltage on the terminal 312 so that electrons can pass from terminal 311 into the floating gate of memory device 301.

Figure 4:
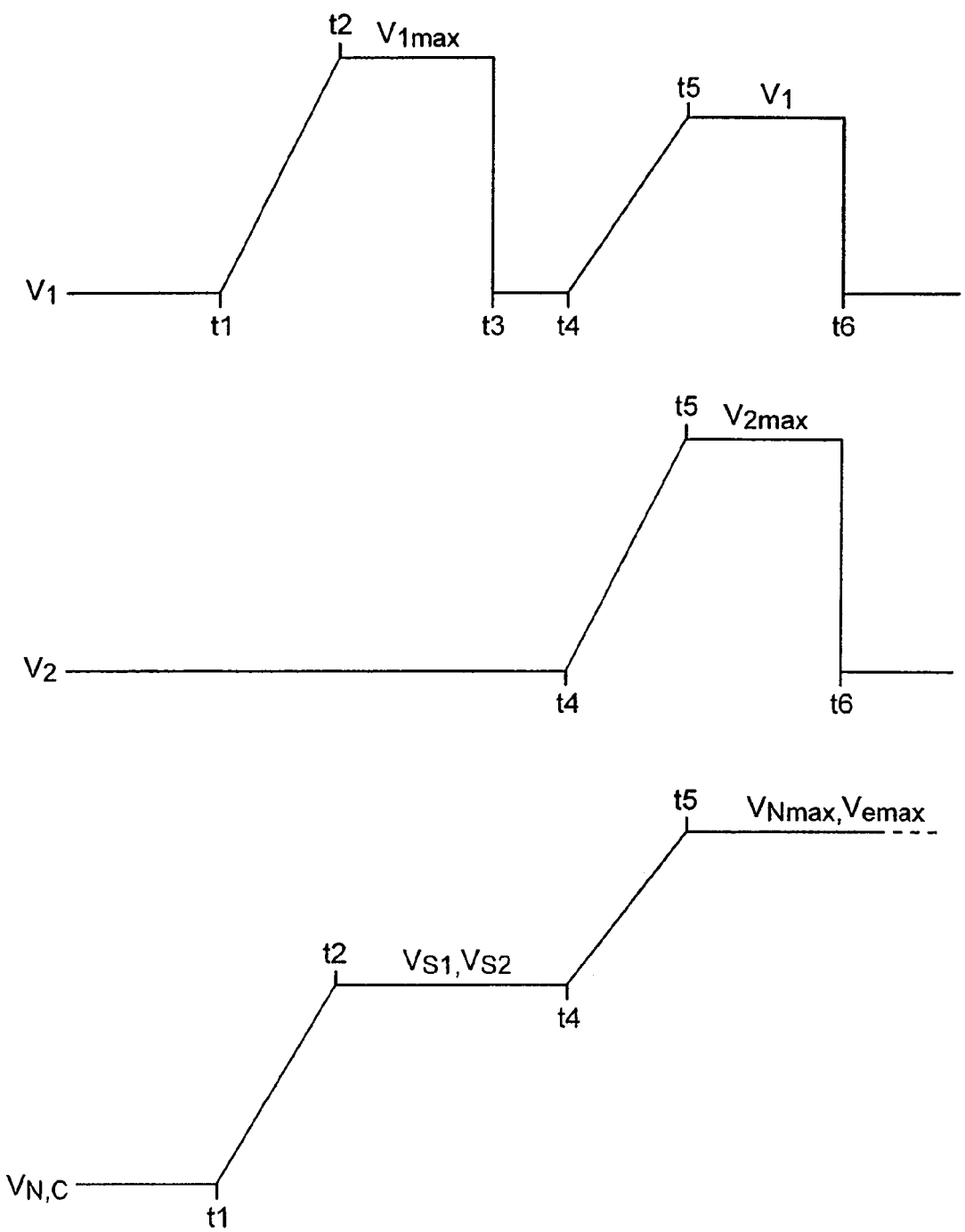
FIG. 4 illustrates an exemplary timing diagram and voltage waveforms for the nonvolatile memory circuit of FIG. 3 according to one embodiment of the present invention.

FIG. 4 illustrates an exemplary timing diagram and voltage waveforms for nonvolatile memory circuit 300 according to one embodiment of the present invention. For an ERASE operation, $V_{S1}$ may be set to some intermediate voltage below the breakdown voltage of other devices in the system, and $V_{S2}$ may be set to ground. At time t1, voltage $V_1$ begins to increase from zero volts. In the present example, $V_{S1}$ is fixed at the intermediate voltage. Thus, transistor 306 is operating as a source follower. In this example, voltage $V_{S1}$, $V_1$, and transistor 306 are effectively acting as a voltage source driving terminal 311. The voltage $V_N$ on terminal 311 will increase up to a maximum of $V_{S1}$. $V_1$ may increase to $V_{1max}$ that is above $V_{S1}$ by a sufficient amount to allow $V_N$ to increase to $V_{S1}$ or close thereto, but below the breakdown voltage of other devices in the system (e.g., $V_{1max}$ may be 1 or 2 volts above $V_{S1}$). At time t2, $V_1$ has reached its maximum value and levels off.

At time t3, voltage $V_1$ is changed back to zero volts, which results in high impedance at terminal 311. Consequently, the voltage on terminal 311 will remain substantially unchanged. At time t4, voltage source $V_2$ begins to increase from zero volts. Since the voltage, $V_N$, on terminal 311 is stored on capacitor C2, increasing voltage $V_2$ will cause an increase in $V_N$. The relationship between the increase in $V_2$ and $V_N$ will be determined by the values of capacitors C1, C2 and the capacitance of the nonvolatile memory $C_{NVM}$. In one embodiment, the capacitance values are set so that the maximum value of $V_2$, $V_{2max}$, at time t5, results in a sufficiently high voltage at $V_N$ for electrons to move from the floating gate to terminal 311, but $V_{2max}$ is still below the breakdown voltage of other devices in the system.

The waveforms for performing a PROGRAMMING operation are similar. For a PROGRAMMING operation, $V_{S2}$ may be set to some intermediate voltage below the breakdown voltage of other devices in the system, and $V_{S1}$ may be set to ground. At time t1, voltage $V_1$ begins to increase from zero volts. In this case, $V_{S2}$ is fixed at the intermediate voltage. Thus, transistor 307 is operating as a source follower driving terminal 312. The voltage $V_C$ on terminal 312 will increase up to a maximum of $V_{S2}$. At time t2, $V_1$ has reached its maximum value and levels off. At time t3, $V_1$ is changed back to zero volts, which results in high impedance at terminal 312. Consequently, the voltage on terminal 312 will remain substantially unchanged. At time t4, voltage source $V_2$ begins to increase from zero volts, causing an increase in $V_C$, so that electrons move from terminal 311 to the floating gate.

In embodiments of the invention that use transistors 306 or 307 as voltage sources, it is advantageous to increase $V_1$ together with $V_2$ during the second phase so that as the pumped up node increases beyond its intermediate value, transistors 306 and 307 are not exposed to voltages greater than their breakdown voltages. For example, at time t4, $V_2$ begins to pump up the voltage at $V_N$ (i.e., an ERASE operation). At the same time, $V_1$ is increasing the voltage on the gate of transistor 306. Increasing the gate voltage of transistor 306 increases the breakdown voltage of transistor 306 because the drain to substrate breakdown voltage increases according to gated-diode breakdown phenomena. It is to be understood that $V_1$ may also be increased during the second phase of a PROGRAMMING operation to increase the breakdown voltage and reduce the stress on transistor 307. Additionally, voltages on other devices in the system may also be increased during the second phase so that the charge-pumped voltage does not breakdown such devices.

Embodiments of the present invention may also benefit by linearly increasing voltages $V_1$ and $V_2$ in during the first and second phases of operation. This technique is also shown in FIG. 4. At time t1, $V_1$ is increasing linearly with time, and at time t4, $V_1$ and $V_2$ are increasing linearly. Linear ramping of the voltages is beneficial because the current in the capacitors is given by the following equation:

$$i_c = C dv/dt$$

Thus, if the voltage is increasing linearly with time, the capacitor currents, and hence the current in the nonvolatile memory device are constant. Consequently, by using a linear ramp with a controlled slope, the flow of electrons into and out of the device may be controlled. Controlling the program and erase currents in the nonvolatile memory device results in limiting the peak electric field in the device. Peak electric field reduction improves reliability. Uncontrolled programming currents can lead to large electric fields in the device, which may damage the nonvolatile memory device as it is programmed and erased over the lifetime of use. It is to be understood that other ramps could be used. For example, other embodiments may use an RC or logarithmic ramp.

Figure 5B:
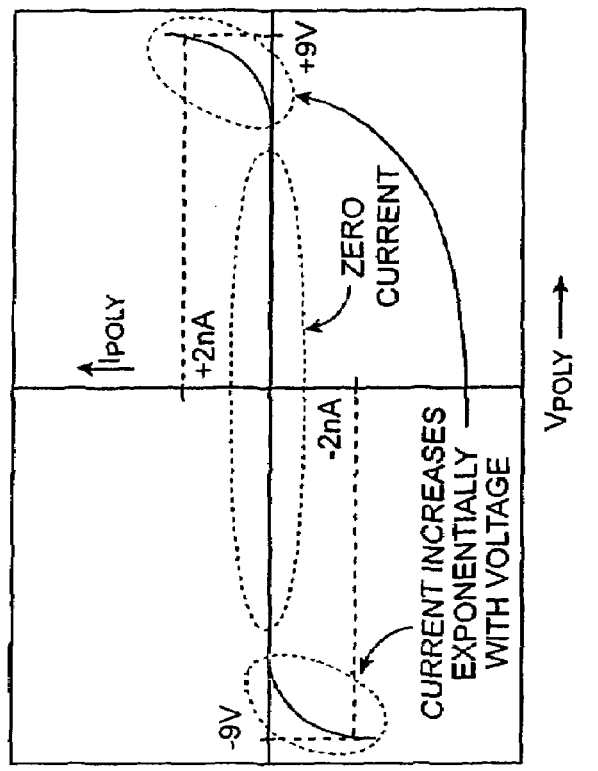
FIGS. 5A–C illustrate the structure, electrical characteristics, and a symbol for a Fowler-Nordhiem electron tunneling nonvolatile memory device according to one embodiment of the present invention.
Figure 5A:
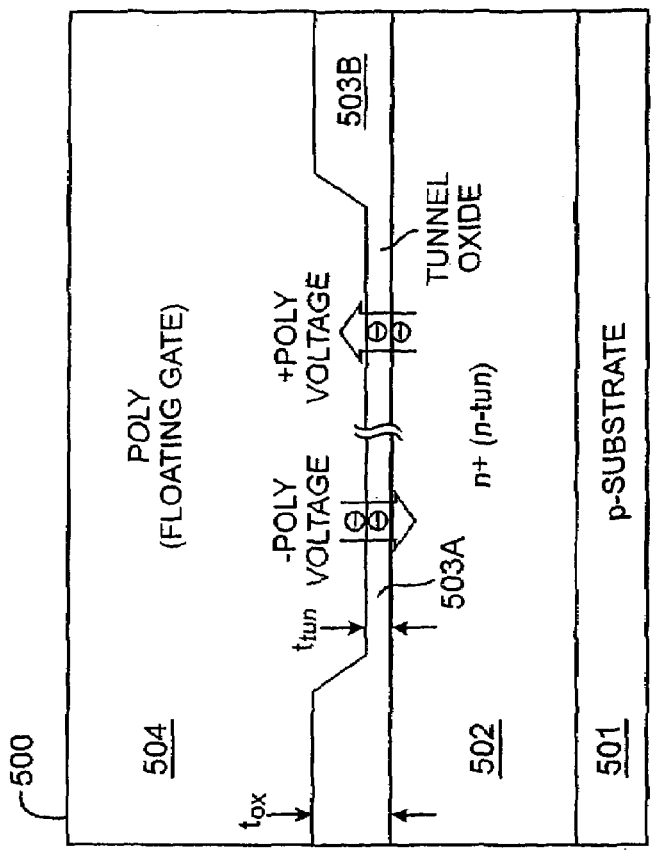
Figure 5C:
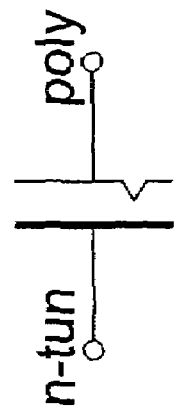

FIGS. 5A–C illustrate the structure, electrical characteristics, and a symbol for a Fowler-Nordhiem electron tunneling ("FN") nonvolatile memory device according to one embodiment of the present invention. FN nonvolatile memory devices are also sometimes referred to as "tunneling capacitors." FIG. 5A illustrates a FN nonvolatile memory device 500 implemented using a single polysilicon layer. FN memory device 500 may be fabricated on a substrate 501 (e.g. a p-type substrate). A doped active region 502 (e.g., an n+region) in substrate 501 is separated from a polysilicon layer 504 by an oxide layer 503. Oxide layer 503 includes a first region 503B having a thickness $t_{ox}$ and a second thin tunnel region 503A having a thickness $t_{tun}$. Example thicknesses for region 503B may be $t_{ox}$=250–1000 Å. Example thicknesses for region 503B may be $t_{ox}$=80–100 Å. In one embodiment, the oxide layer thickness $t_{ox}$ is about 330 Å and the tunnel oxide thickness $t_{tun}$ is about 90 Å. Furthermore, the tunnel window may be a square region having a width of about 1.15 um on each end. However, it is to be understood that other thicknesses, dimensions, or shapes may be used.

FIG. 5B illustrates the electrical characteristics of the FN nonvolatile memory device of FIG. 5A shown on a linear scale. Under sufficient bias conditions, electrons will tunnel through the tunnel oxide region 503A. For example, if the n+region is grounded and the voltage on the polysilicon region ("$V_{POLY}$") is increased from zero volts, the initial current will be substantially zero. However, as the voltage approaches the positive "threshold" voltage of the memory device (i.e., the voltage at which significant tunneling current flows), electron tunneling will increase through the tunnel oxide window and a corresponding increase in current may be observed. For example, as the voltage on the polysilicon region approaches +9 volts (i.e., for a 90 Å oxide thickness), as shown in 5B, a positive current will begin to increase approximately exponentially as electrons tunnel from the n+region to the polysilicon region. Similarly, if the voltage on the polysilicon region ("VPOLY") is decreased from zero volts, the current will be substantially zero until the voltage approaches the negative threshold voltage of the memory device. As shown in FIGS. 5A and 5B, electrons will begin to tunnel from the polysilicon region to the n+region as the voltage on the polysilicon approaches −9 volts, at which point a negative current from the polysilicon region to the n+region will begin to increase approximately exponentially.

FIG. 5C illustrates a symbol for the FN nonvolatile memory device. Because the FN nonvolatile memory device 500 is similar in structure to a capacitor, it has an associated parasitic capacitance caused by the separation of the polysilicon region from the n+region. Thus, FN nonvolatile memory device 500 may be represented as a modified capacitor as shown in FIG. 5C. One terminal of the capacitor is an n+region sometimes referred to as "n-tun," and the other terminal is the polysilicon region, which is typically used as the floating gate terminal. The tunneling current in an FN memory device is a function of the applied electric field. The current density is given by the following equation:

$$J_{FN} = aE^2 \exp(-b/E)$$

where $J_{FN}$ is the current density of the tunnel current, E is the field between the tunneling electrodes, a=2E−6 amps/volts$^2$ and b=2.385E+8 V/cm. As can be seen from the expression for J, the tunnel current goes to extremely small values for low electric fields, but does not reach zero except for zero field.

Figure 6A:
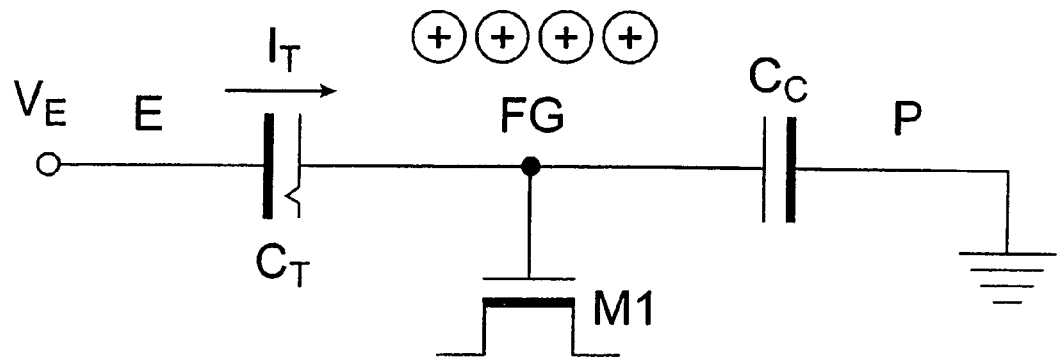
FIGS. 6A–B illustrate an ERASE operation using a FN nonvolatile memory.
Figure 6B:
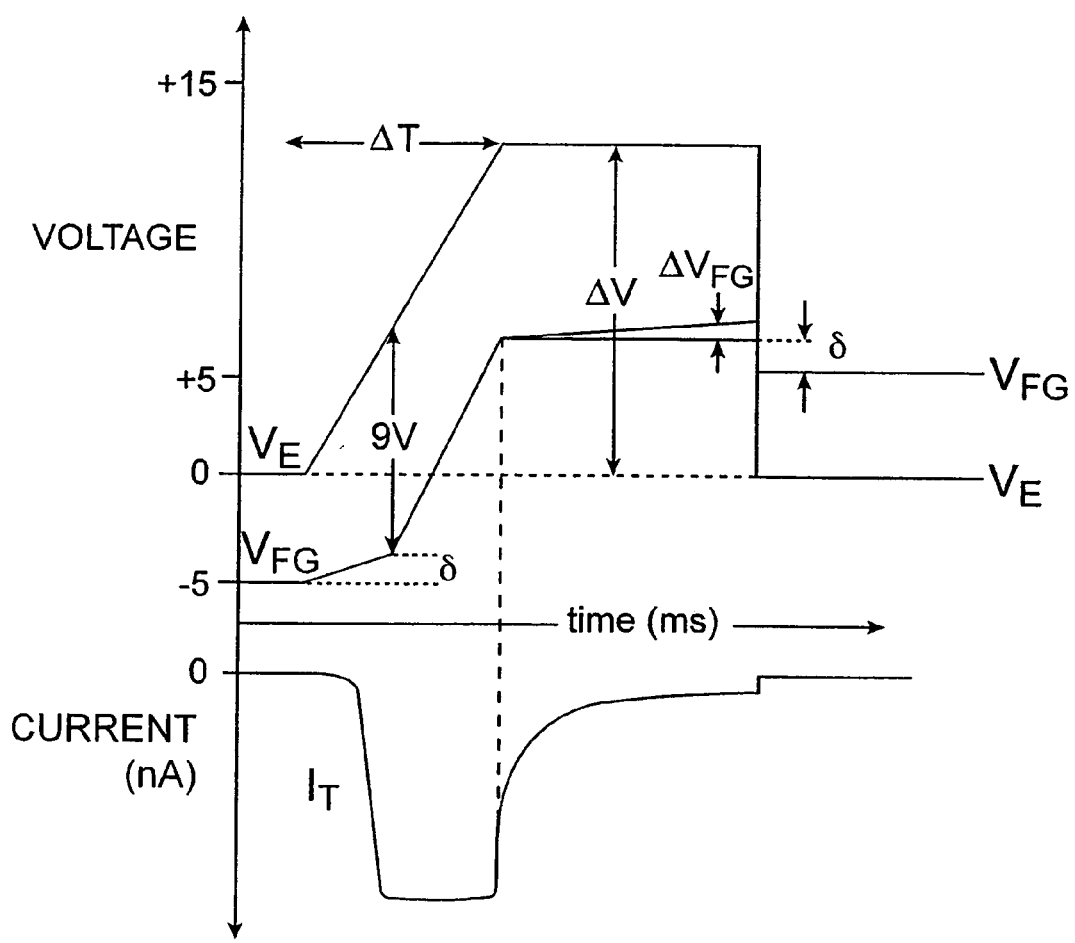

FIGS. 6A–B illustrate an ERASE operation using a FN nonvolatile memory device. In FIG. 6A, a nonvolatile memory element is coupled between two voltages, which in this case are $V_E$ and ground. The nonvolatile memory element includes a FN device and a capacitor. As shown in FIG. 6A, one terminal of the FN device (e.g., the n+region) is coupled to a voltage $V_E$. The other terminal (e.g., the polysilicon region) is used as a floating gate. The floating gate may be coupled to one plate of a capacitor $C_C$ and to the gate of a MOS transistor M1 for sensing the voltage on the floating gate. The other plate of capacitor $C_C$ is grounded. Initially, $V_E$ is at zero volts, the floating gate is assumed here to be at −5 volts as a result of a prior PROGRAMMING operation, and the current in the FN device, $I_T$, is zero. The voltage on the floating gate, $V_{FG}$, is initially controlled by $V_E$ and the capacitive voltage divider created by capacitor $C_C$ and the intrinsic capacitance of the FN device, $C_T$. As $V_E$ increases, $V_{FG}$ will increase in accordance with the capacitor values. This continues as long as the voltage across the memory device is below the "threshold" voltage (e.g., $(V_E-V_{FG})<+9$ volts). The rate that $V_{FG}$ increases can thus be controlled by setting the value of $C_C$. If $C_C$ is much larger than $C_T$, then the majority of the voltage $V_E$ will appear across the memory device. For example, if the capacitance of $C_C$ is nine times the capacitance of $C_T$, then 90% of $V_E$ appears across the FN device. Consequently, the slope of $V_E$ is typically greater than the slope of $V_{FG}$.

When the voltage across the FN memory device, $(V_E-V_{FG})$, approaches the threshold voltage, electrons will begin to tunnel through the memory device and off of the floating gate. Thus, $V_{FG}$ increases to a first voltage, $-5+\delta$, at which point the current $I_T$ will increase significantly, and the floating gate voltage will now be controlled by $I_T$, which is proportional to the rate of change of $V_E$ versus time (i.e., $\Delta V_E/\Delta T$). Consequently, the floating gate voltage, $V_{FG}$, will increase at an approximately constant rate until $V_E$ levels off. When $V_E$ levels off, the voltage on the floating gate continues to increase by an amount $\Delta V_{FG}$ because the current does not go immediately to zero. At the end of the ERASE cycle $V_{FG}$ has increased to a new value (e.g., +5 volts from −5 volts). The change in voltage may be sensed by NMOS transistor M1, which will be turned on because of the increased voltage on the floating gate. Finally, $V_E$ may be set back to zero volts, causing a slight voltage reduction, δ, in $V_{FG}$ caused by the capacitive voltage divider of $C_T$ and $C_C$.

Figure 7A:
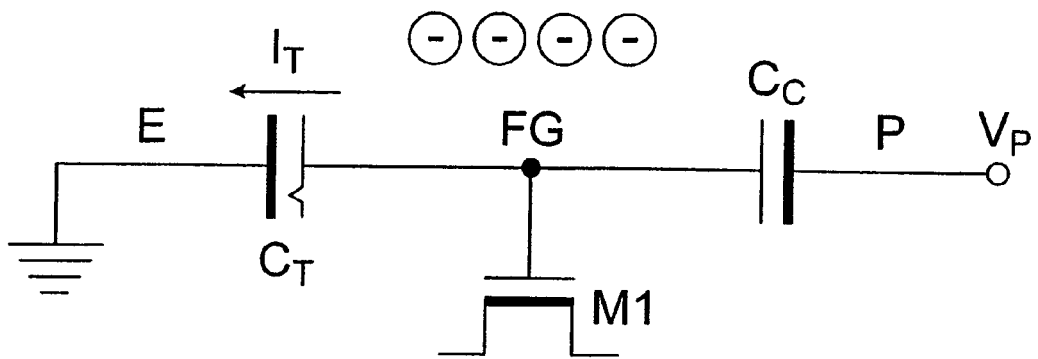
FIGS. 7A–B illustrate a PROGRAMMING operation using a FN nonvolatile memory.
Figure 7B:
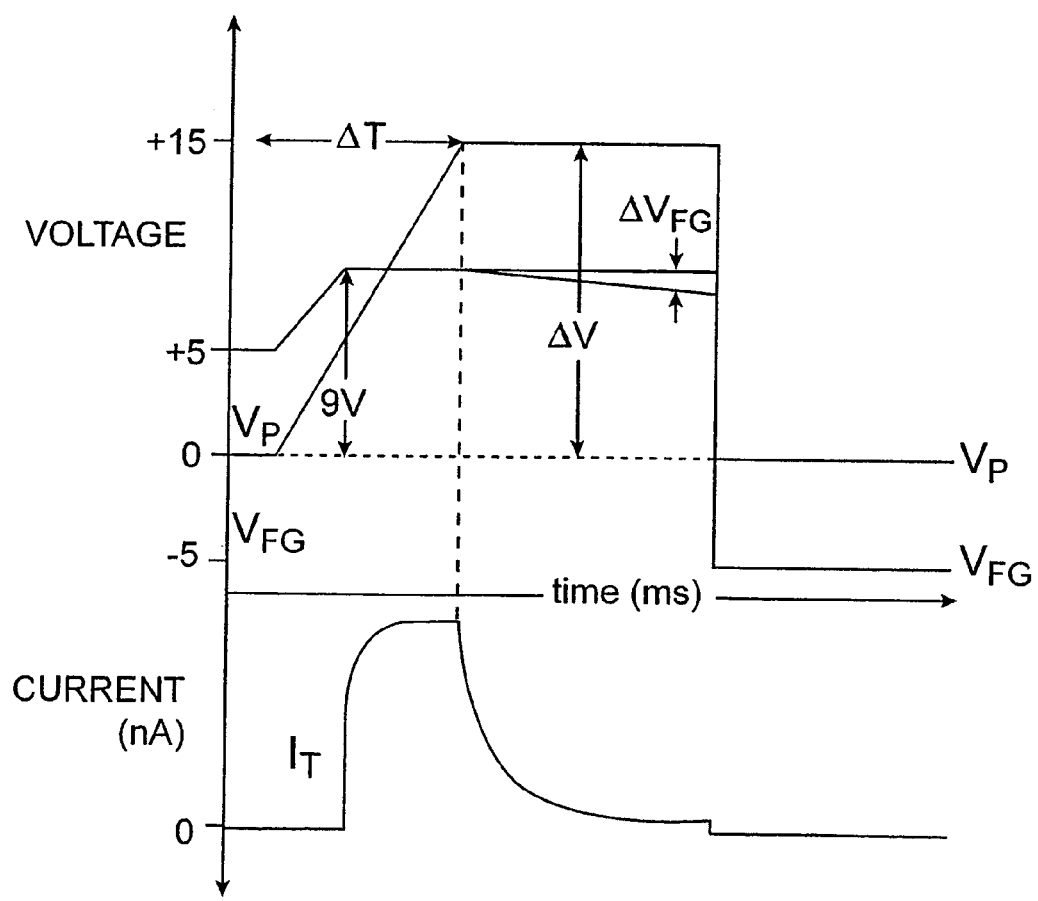

FIGS. 7A–B illustrate a PROGRAMMING operation using a FN nonvolatile memory device. As shown in FIG. 7A, one terminal of the nonvolatile memory device (e.g., the n+region) is coupled to ground. In this case, capacitor $C_C$ receives a voltage $V_P$ for programming. Initially, $V_P$ is at zero volts, the floating gate is assumed to be at +5 volts as a result of a prior ERASE, and the current in the memory device, $I_T$, is substantially zero. $V_{FG}$ is controlled by $V_P$ and the capacitive voltage divider created by $C_C$ and $C_T$ as long as the voltage across the memory devices is below the threshold voltage (e.g., $(V_{FG}-V_E)<+9$ volts).

When the voltage across the FN device, $(V_{FG}-V_E)$, approaches the "threshold" voltage, electron tunneling through the device and onto the floating gate will increase. Thus, $V_{FG}$ increases to a first voltage, in this case +9 volts, at which point the current $I_T$, which is proportional to the rate of change of $V_P$ versus time (i.e., $\Delta V_E/\Delta T$), will begin to flow. The floating gate voltage, $V_{FG}$, will remain at +9 volts as long as $V_P$ is ramping. When $V_P$ levels off, the voltage on the floating gate decreases by an amount $\Delta V_{FG}$ because the current does not go immediately to zero. At the end of the PROGRAMMING cycle $V_P$ is brought back to zero volts, causing $V_{FG}$ to drop to its new value (e.g., −5 volts). The change in voltage may be sensed by NMOS transistor M1, which will be turned off because of the reduced voltage on the floating gate. It is to be understood that embodiments of the present invention may also increase $V_E$ and $V_P$ to intermediate voltages below the threshold voltage of the memory device during a first time period, and then charge pump $V_E$ and $V_P$ to final voltages during a second time period as set forth above.

Figure 8:
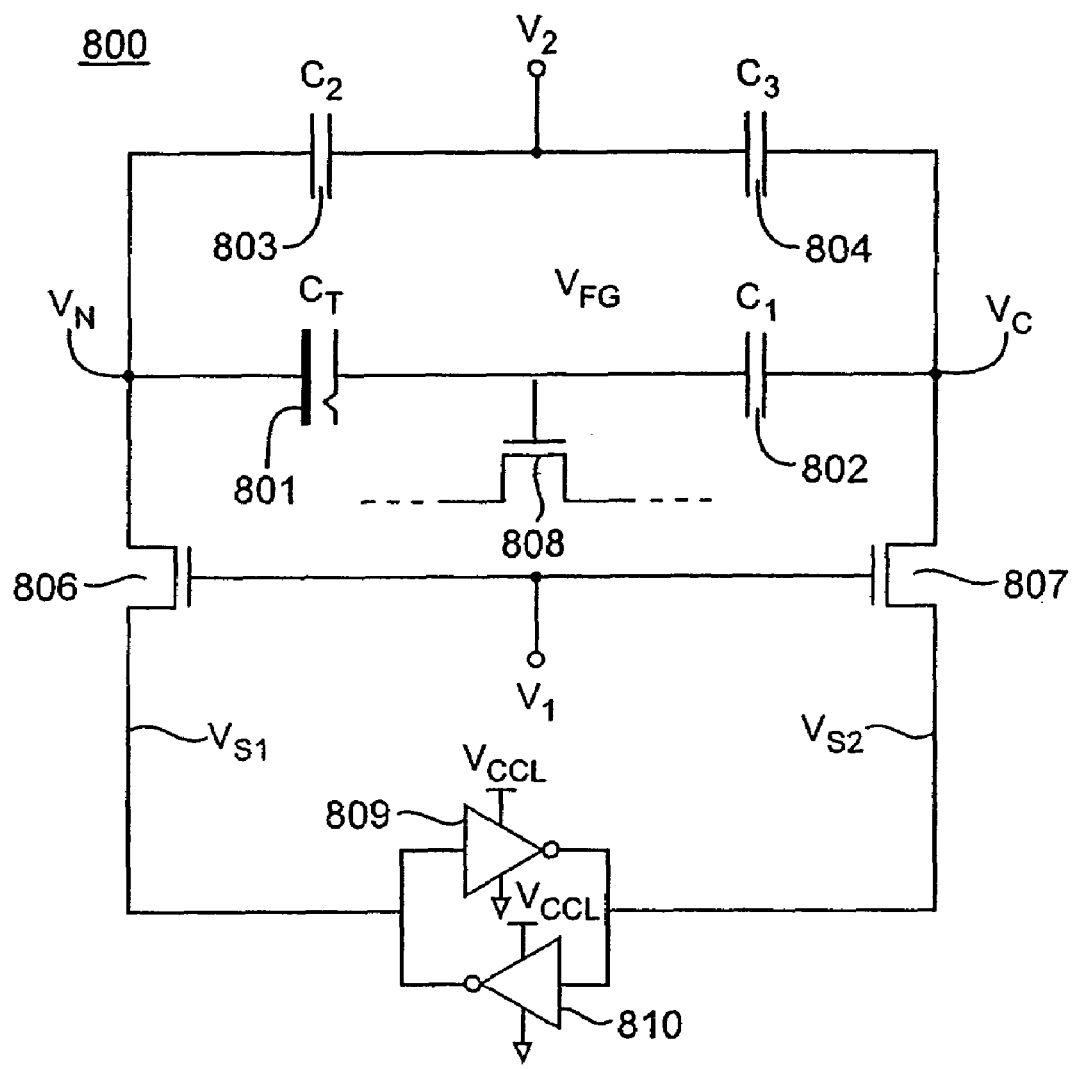
FIG. 8 illustrates a nonvolatile memory according to another embodiment of the present invention.

FIG. 8 illustrates a nonvolatile memory according to another embodiment of the present invention. Nonvolatile memory 800 includes a memory element comprising a FN device 801 having an intrinsic capacitance $C_T$ and a capacitor 802. Memory 800 also includes MOS transistors 806 and 807 for sourcing voltage across the memory element 801–802 during the first phase of a program or erase operation, charge pump capacitors 803–804 for increasing the voltage across memory element during the second phase of a program or erase operation, and a latch comprised of inverters 809 and 810 for storing data that provides the program or erase values to be written into memory element 801. For example, during an ERASE operation, the output of inverter 810 may be at a high logic level (e.g., $V_{CCL}$) and the output of inverter 809 will be at a low logic level (e.g., −$V_{CCL}$ or ground). Thus, the voltage output of inverter 810, $V_{S1}$, will provide a positive voltage to transistor 806 during the first phase of the ERASE cycle, and $V_{S1}$, will appear at node $V_N$ when voltage source $V_1$ is applied. Likewise, the voltage output of inverter 809, $V_{S2}$, will provide a low voltage to transistor 807 during the first phase of the ERASE cycle, and $V_{S2}$ will appear at node $V_P$ when voltage source $V_1$ is applied. Similarly, the data value in inverters 809 and 810 may be changed so that the inverters provide opposite voltages across memory element 801 during a PROGRAMMING operation.

In one embodiment, the supply voltage on the inverters, $V_{CCL}$, may be modified during ERASE and/or PROGRAMMING operations so that the corresponding value applied to node $V_N$ (or $V_P$) is optimized. For example, during the first phase of a cycle, embodiments of the present invention may provide a voltage across memory element 801–802 such that the floating gate will be rendered charge neutral. Since this voltage is controlled by the supply voltage on the inverters, $V_{CCL}$ may be modified (e.g., increased) during an ERASE or PROGRAMMING operation so the voltage applied to node $V_N$ (or $V_P$) is just at the voltage which will cause the floating gate to be charge neutral. During the second phase of the cycle, the voltage at node $V_2$ is provided to charge pump the voltage across memory element 801–802, and the data value stored in the latch is transferred to the nonvolatile memory.

Figure 9:
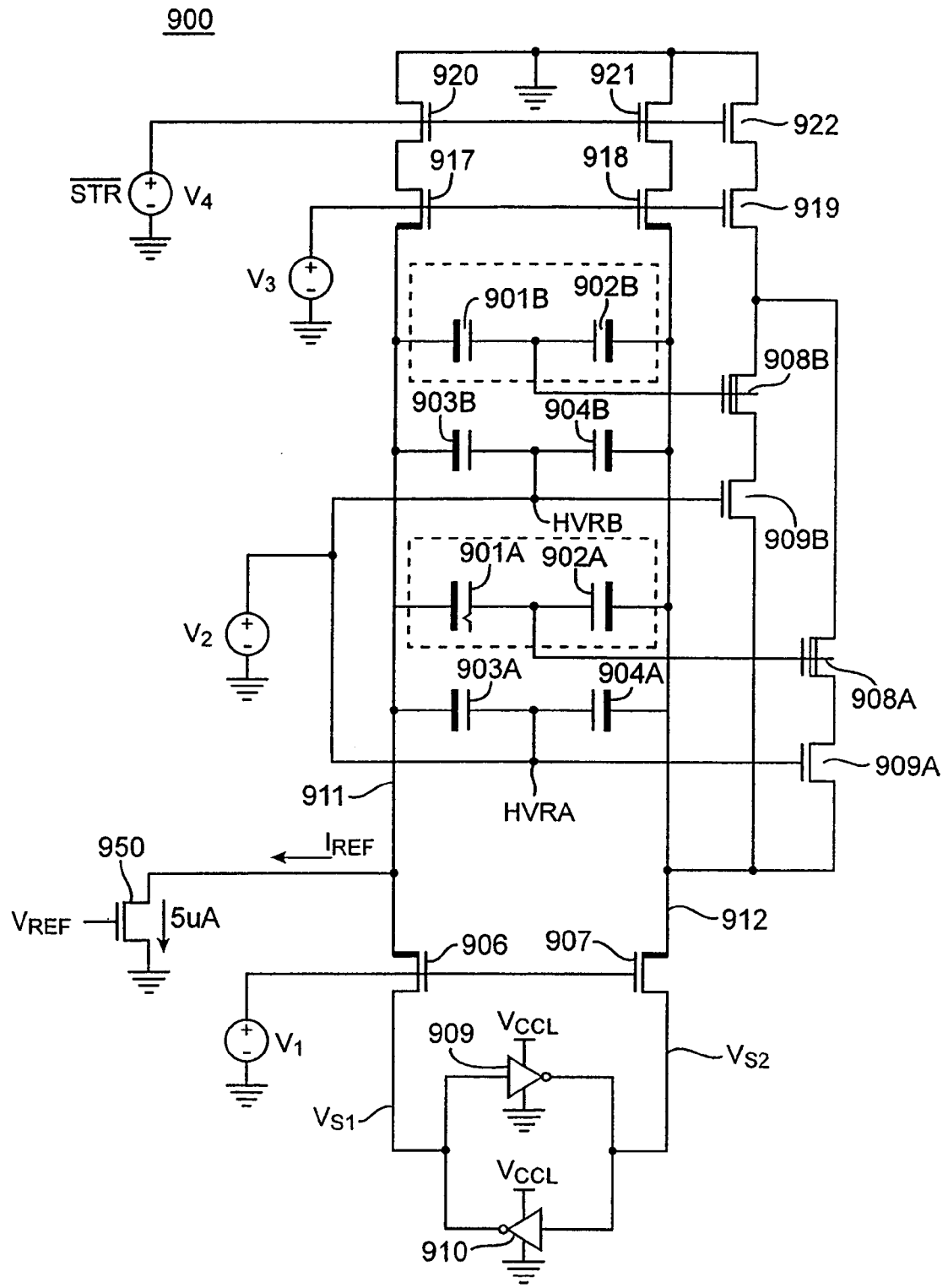
FIG. 9 illustrates a nonvolatile memory according to yet another embodiment of the present invention.

FIG. 9 illustrates a nonvolatile memory according to another embodiment of the present invention. Nonvolatile memory 900 includes redundant nonvolatile memory elements, each comprising FN devices 901A–B and capacitors 902A–B, redundant charge pumps including capacitors 903–904A and 903–904B, sense transistors 908A–B, gate transistors 909A–B, and a latch including inverters 909 and 910 for storing a data value and for providing the voltages across the memory elements during PROGRAM and ERASE operations in accordance with the data value stored in the latch. The voltages from the latch are coupled across memory elements 901–902A and 901–902B by transistors 906 and 907. It is to be understood that the redundant elements are advantageous, but not necessary to the present example.

Nonvolatile memory 900 illustrates another aspect of the present invention. In one embodiment, the present invention may be implemented in a single polysilicon layer of a standard CMOS process. Memory element capacitors 902A and 902B, and charge pump capacitors 903A–B and 904 A–B use a modified symbol to show that these devices are implemented on such a process. In particular, one plate on each of these capacitors is darkened to illustrate that each such plate is implemented as an n+ diffusion region. Moreover, the N diffusions of NMOS transistors 906, 907, 917, and 918, which are coupled to the high voltage nodes 911–912, are darkened to illustrate P-field "pull back" to improve each transistors voltage breakdown characteristics as discussed below.

Figure 10:
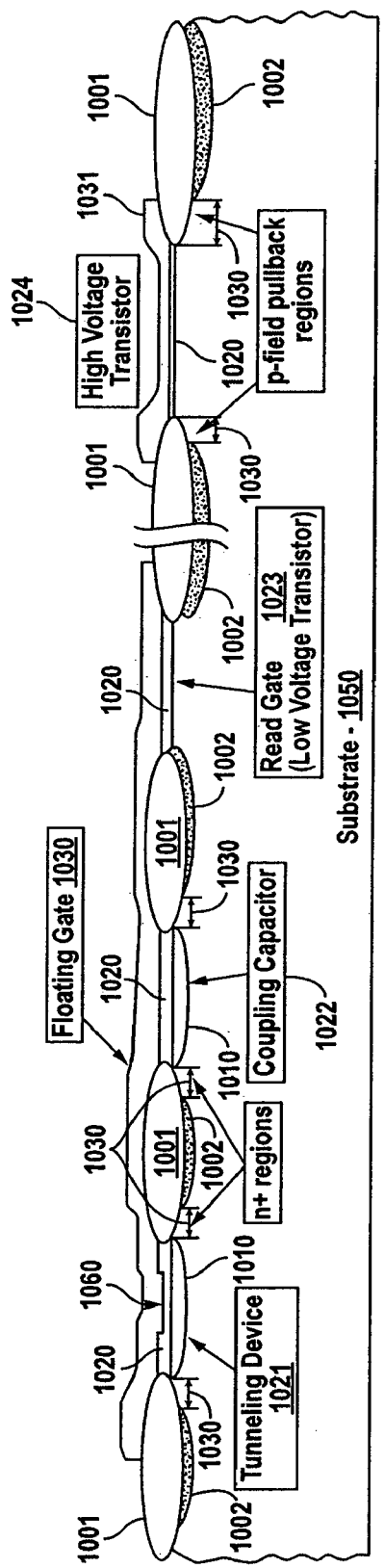
FIGS. 10 and 10A are cross sections of a nonvolatile memory implemented using only a single polysilicon layer according to one embodiment of the present invention.
Figure 10A:
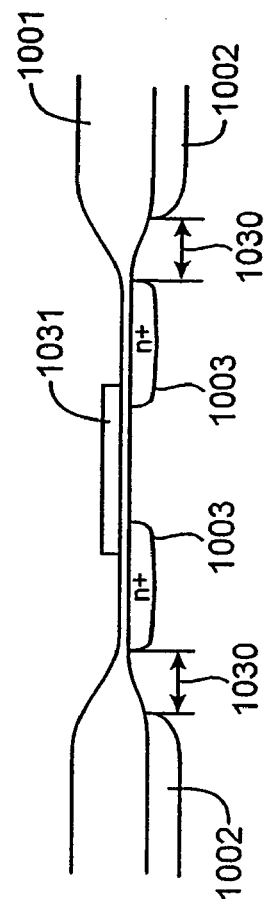

FIG. 10 is a cross-section of a nonvolatile memory implemented using only a single polysilicon layer according to one embodiment of the present invention. The cross-section shows a memory element comprising a FN tunneling device 1021 and a coupling capacitor 1022. The cross-section also shows sense transistor 1023, which may be referred to as a "read gate," and a high voltage transistor 1024, which may be any one of the transistors 906, 907, 917, and 918 that are coupled to the high voltage nodes 911–912. Charge pump capacitors 903A–B and 904A–B are not shown, but these capacitors may be formed in the same way as coupling capacitors 902A–B. The devices in FIG. 10 are manufactured on a substrate 1050, which may be a P-type substrate, for example. The devices are separated by field oxides 1001. Isolation between the devices is further enhanced by introducing a P-field doping 1002 under each field oxide region. Such doping may be made by ion implantation. Doped n+regions 1010 for the FN tunneling devices 901A–B and for the capacitors may formed by implantation, for example. A gate oxidation layer 1020 is provided, which may be used to form MOS transistors, capacitors, or FN tunneling devices. With regard to high voltage transistor 1024, it is to be understood that the source and drain regions are on either side of the gate as shown in FIG. 10A, which is oriented at a right-angle to FIG. 10.

FIG. 10 also illustrates another feature of the present invention. Since the n+region of tunneling device 1021 is coupled to node 911 in memory 900 of FIG. 9, and since the n+ region of capacitor 1022 is coupled to node 912, these regions will be subject to high voltages during the second phase of the erase and program cycles, respectively. Similarly, doped regions of transistors 906, 907, 917, and 918 and the n+regions of the charge pump capacitors are also coupled to nodes 911–912, and will be subject to high voltages. Breakdown voltages of devices coupled to the high voltage nodes may be increase by "pulling back" the P-field implant under the field oxides as shown at 1030. For example, the breakdown voltage of the FN devices, the coupling capacitors, the charge pump capacitors, and the high voltage transistors (e.g., transistors 906, 907, 917, and 918) may be increased by P-field pull back 1030 as shown in FIG. 10. FIG. 10 further illustrates P-field pull back from source and drain regions 1003 of high voltage transistor 1024. While FIG. 10 illustrates implementation in a single layer standard CMOS process, it is to be understood that circuits embodying the present invention may also be implement in other processes such as a multiple polysilicon CMOS process or BiCMOS processes having one or more polysilicon layers.

Returning to FIG. 9, it can be seen that nonvolatile memory 900 is an example of a NOVRAM configuration. A NOVRAM is a nonvolatile memory bit coupled to a Static RAM bit. The static RAM bit is based on the latch or "flip-flop." A NOVRAM configuration has several advantages over other configurations. For example, when the memory is operated out of the static RAM bit (SRAM), read and write operations can occur at high speeds without wearing out the nonvolatile portion of the memory. No program/erase cycles are consumed. Once a data pattern is satisfactory, as determined by SRAM operation, it can be programmed or erased into the nonvolatile memory. This operation is called a "STORE" operation. Additionally, the data stored in the nonvolatile memory can be used to set the data value in the latch. This operation is called a "RECALL" operation.

The STORE operation transfers the data from the static RAM (latch) to the nonvolatile memory. The STORE takes place in two steps wherein a first voltage is applied during a first time period ("a Precharge Cycle (PCC)") and the voltage across the nonvolatile memory elements is pumped up during a second time period ("a High Voltage Cycle (HVC)"). During the PCC, the latch power level, $V_{CCL}$, is increased from its nominal value (e.g., from 5V to about 11V). One side of the latch then outputs a logic high voltage (e.g., 11V) to the plates of capacitors 902–904A–B coupled to nodes 911 and 912. In one embodiment, these capacitor plates are high voltage diffusions which lie under a polysilicon layer. The other side of the latch outputs 0V or ground to the other set of plates. Additionally, $V_1$ is an intermediate voltage used to control the gating of the high voltage capacitor/floating gate section of the cell. Voltage source $V_1$ is increased during PCC and a voltage across each memory element is set by the latch output voltages. For example, $V_1$ may be raised to 12 volts so that one of transistors 906 or 907 acts as a source follower. Thus, the latch data value sets the voltage across each memory element, which determines whether the floating gates will be programmed (charged with electrons) or erased (depleted of electrons). In one embodiment, the cells are programmed or erased to about the neutral condition (i.e., about "half-way" programmed or erased) during the PCC. In one embodiment, the PCC is about ½ to 1 millisecond, but the timing may be more or less depending on the particular characteristics of the design.

For the embodiment shown in FIG. 9, additional voltages may be used to control other devices in the circuit. For example, during PCC voltage source $V_2$ is held at ground. Additionally, $V_4$ is a "store bar" signal (i.e., active low when a STORE operation is in progress) called STR\. $V_3$ may be used to provide bias to transistors 917 and 918 to increase high voltage breakdown (BVdss) and simultaneously reduce some local voltage differences in order to increase reliability.

The HVC cycle starts after the PCC. During this time period, voltage source $V_2$ is pulsed to a high voltage (e.g., 12 volts). In this example, voltage source $V_2$ is coupled to lines HVRA and HVRB, which may be made of polysilicon and which also form plates of capacitors 903–904A–B that are opposite the diffused plates described above. When HVRA and HVRB are increased, for example to 12V, they further increase the voltage on either node 911 or 912 (program or erase) from the value set during the PCC. For example, the voltage may increase from about 11V to about 16V. After reaching this voltage level, and after the HVC pulse has timed out (e.g., after about ½ to 1 ms) the floating gates are fully programmed or erased. Floating gate voltages are then set (e.g., about +/−3V). If node 911 is driven high, then it can be seen that the latch will hold node 912 at ground during HVC. Similarly, if node 912 is driven high, then it can be seen that the latch will hold node 911 at ground during HVC. After the STORE operation is completed, $V_1$ is returned to ground and $V_{CCL}$ returns to it nominal value (e.g., about 4V).

The RECALL operation transfers the data of the nonvolatile memory element's floating gate into the static RAM portion (the latch) of the memory cell. Embodiments of the present invention may include a nonvolatile memory element 901 wherein the data value in the memory element is used to control current into one side of a sense amplifier, thereby controlling the resulting data value produced during a RECALL. This is exemplified in FIG. 9, where the voltage on the floating gate of nonvolatile memory element 901A is used to control the current through transistor 908A. The current through transistor 908A is coupled to one side of the latch, and a reference current, $I_{REF}$ is coupled to the other side of the latch. Thus, the latch may be used as a sense amplifier to sense the data value stored in the nonvolatile memory element.

Figure 11:
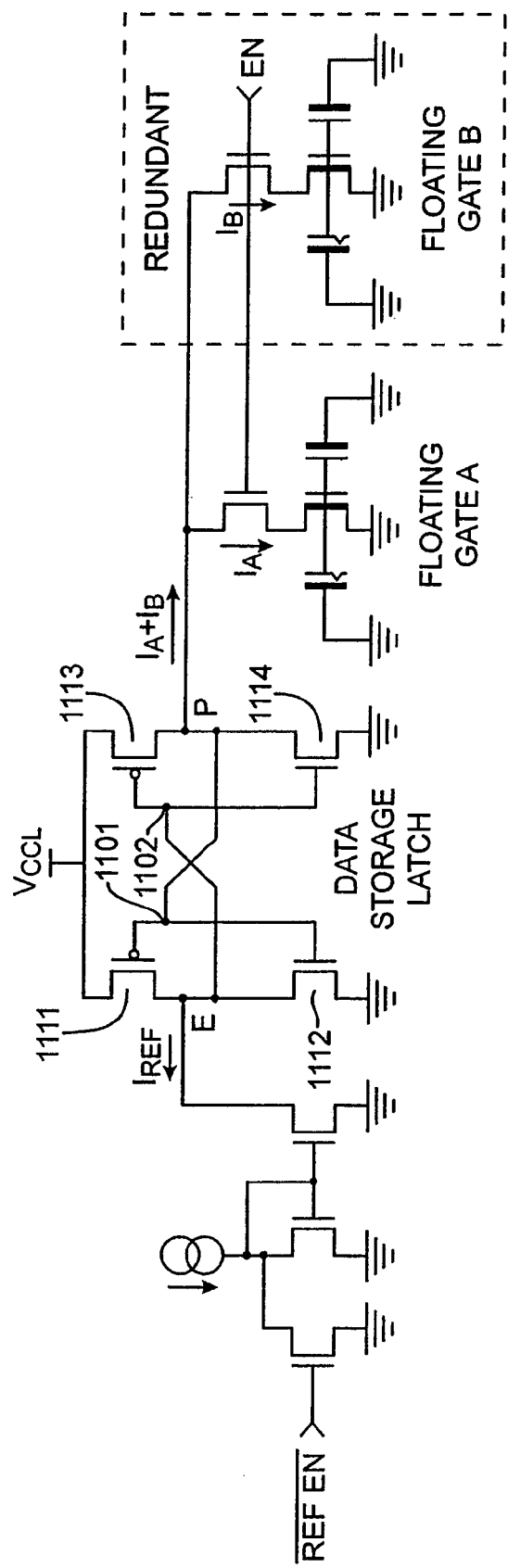
FIG. 11 illustrates a data recall technique according to another aspect of the present invention.
Figure 12:
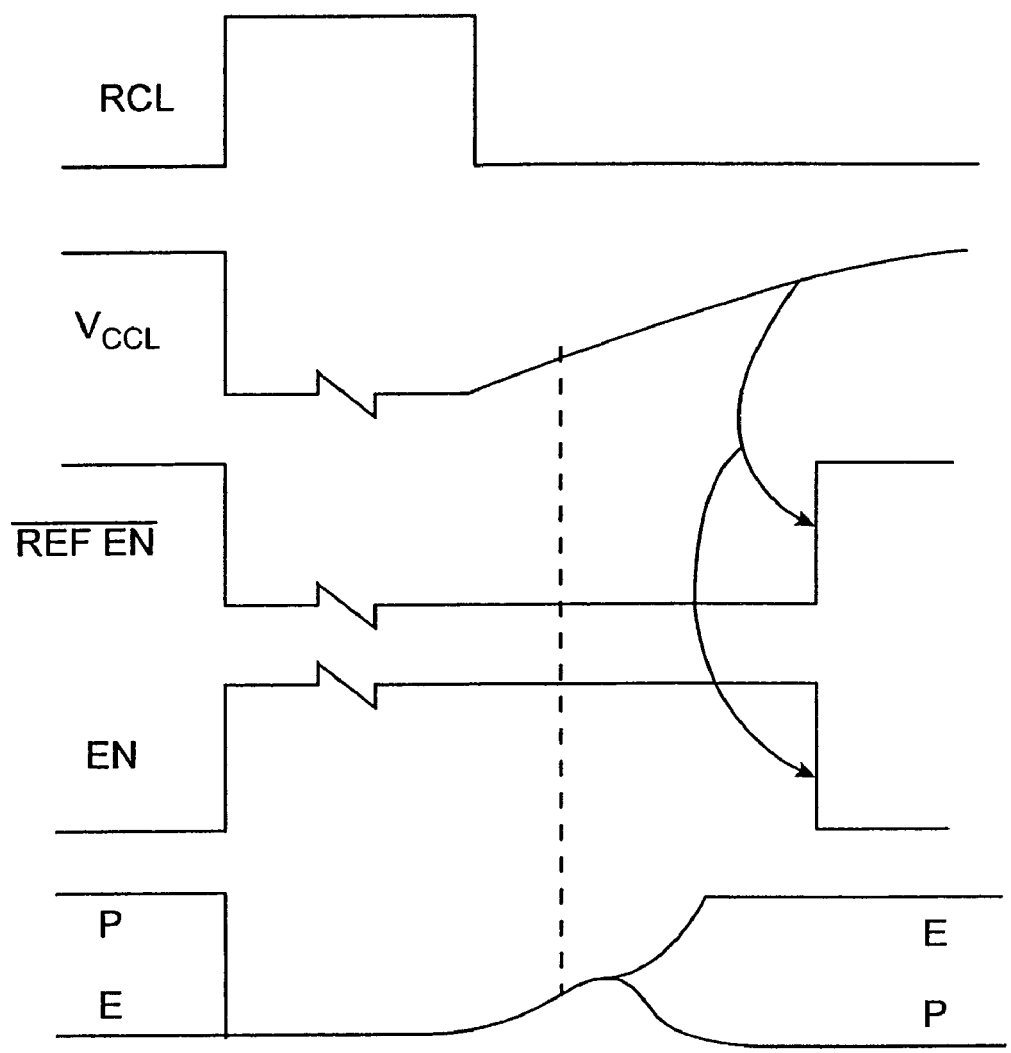
FIG. 12 shows a signal diagram for FIG. 11.

In one embodiment, the power line to the cell latch ($V_{CCL}$) may be pulsed to ground and ramped in a controlled fashion back to the supply level (e.g., 4–5V). Application of this technique to a redundant cell is shown in more detail in FIGS. 11–12. FIG. 11 illustrates that two currents $I_A$ and $I_B$, one from each memory element, may be coupled to the latch and controlled by an enable signal ("EN"). Currents controlled by the memory elements are compared to a reference current $I_{REF}$ in the data storage latch, which is shown in FIG. 11 as comprising cross coupled CMOS transistors. The first pair of CMOS transistors 1111–1112 has a latch node 1101 connecting the gates of the transistors to the outputs of transistors 1113–1114 and to the current from the nonvolatile memory elements, and the second pair of CMOS transistors 1113–1114 has a latch node 1102 connecting the gates of the transistors 1113–1114 to the outputs of transistors 1111–1112 and to $I_{REF}$. $I_{REF}$ may be generated by a current mirror and a RECALL logic bit "REF EN\", for example. FIG. 11 shows a signal diagram for FIG. 11. A recall signal RCL goes high at the beginning of a RECALL cycle. Additionally, $V_{CCL}$ and REF EN\ go low and EN goes high, thereby clearing the value in the latch and simultaneously activating both the reference current and the sense current, if any. The supply voltage on the latch is increased (e.g., ramped), and the latch functions as a sense amplifier and senses the 1 or 0 states (conductive or nonconductive) of the sense transistors controlled by the floating gates. In performing the sensing function, the latch compares the current to the reference current (e.g., $I_{REF}$=5 uA) and finishes with a stable data value in the latch at the end of the RECALL cycle.

NOR logic may be used to control transistors 909A–B. If the floating gate of a memory element is changed to a positive voltage (e.g., more than 1 volt), then its corresponding sense transistor 908 is conducting. If either or both of transistors 909A–B is conductive, that condition is enough to cause the cell to output a logical "1" (i.e., a current) after a RECALL operation. On the other hand, in order to output a logical 0 (i.e., no current), both sense transistors must be nonconductive (i.e., both floating gates are high). These logical choices are used in the present embodiment because the naturally discharged or "neutral" state of the sense transistors is assumed to be nonconductive—a '0'. This is because the sense transistors are N channel enhancement type that may have a threshold of about +0.4V when the floating gates carry no excess charge. Therefore the logic provides redundancy for the conductive state—a '1'. The NOR logic also contains extra select gating on each of the two legs of the NOR (i.e., the enable signal "EN"). By selecting one or the other leg with series select transistors, each floating gate can be tested separately in manufacturing. In FIG. 9, HVRA and HVRB operated separately provide the gating to test each side of the NOR in manufacturing.

In one embodiment, the RECALL is signaled automatically when the chip powers up, and may be initiated by a Power-On-Reset circuit, for example. This is referred to as an automatic RECALL. In another embodiment, a RECALL is initiated by the user after the chip has powered up. This is a controlled RECALL. Thus, it will be appreciated that the latch may perform many functions in the circuit: Hold data (static memory), Precharge Voltage Driver during STORE, and Sense Amplifier during RECALL. However, the latch may also be used as part of the data output circuit or as part of an input shift register, as set forth in more detail below.

Figure 13:
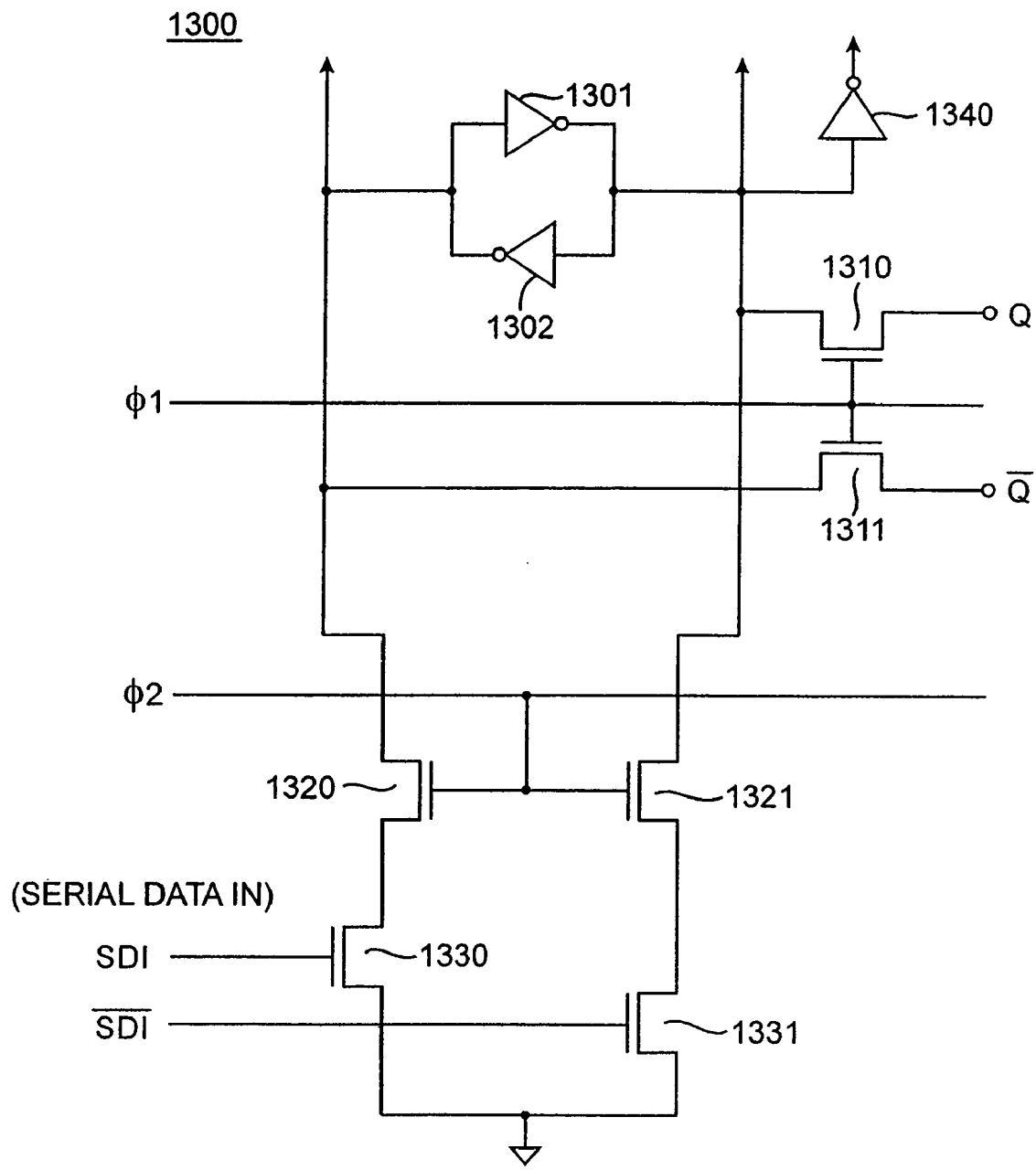
FIG. 13 illustrates a shift register according to another aspect of the present invention.

FIG. 13 illustrates a shift register stage 1300 according to another aspect of the present invention. Shift register stage 1300 may be used to load a latch with data values that are to be stored in the nonvolatile memory element, to extract data values that are stored in the nonvolatile memory element, or to shift data values between stages. For example, in an array of memory cells, the first memory cell in a row of memory cells may be the Serial Data In, and the output of the last memory cell in a row of memory cells may provides Serial Data Out. After the data is serially shifted into each register stage, a STORE operation may be preformed and the nonvolatile memory elements in the array will thereafter maintain the data values. Similarly, after a RECALL operation is performed, the data values transferred from the nonvolatile memory elements to their respective latches may be serially shifted to the Serial Data Output.

Shift register 1300 includes complementary serial data input lines SDI and SDI\ that are the inputs of the shift register and complementary serial data output lines Q and Q\ that are the outputs of the shift register. To load data into the register, the values of SDI and SDI\ are applied to the gates of transistors 1330 and 1331. Data is written into the register by clocking the serial clocks $\phi_2$ high (e.g., 5 volts for NMOS transistors), so that transistors 1320 and 1321 are coupled to the drains of transistors 1330 and 1331. During this time, $\phi_1$ is low (e.g., 0 volts), and transistors 1310 and 1311 are off. Since SDI and SDI\ are complementary, one of transistors 1330 and 1331 will be turned on and the other will be turned off. Thus, one side of the latch will be coupled to ground, and the other side of the latch will be floating, and the latch will be set to a state determined by the values of SDI and SDI\. For example, if SDI is high, then SDI\ is low, and the output of inverter 1301 will be high when $\phi_2$ is applied and the output of inverter 1302 will be low. During the next phase of the cycle $\phi_2$ goes low and $\phi_1$ goes high so that transistors 1320 and 1321 are decoupled to the drains of transistors 1330 and 1331 and transistors 1310 and 1311 are turned on. Q and Q\, which are the outputs of shift register stage 1300, may be the SDI and SDI\ inputs of another shift register stage. Thus, data from the latch may be transferred out to the next stage when $\phi_2$ goes low and $\phi_1$ goes high.

Those skilled in the art will recognize that the added gating and a two-phase non-overlapping clock arrangement transform the latch plus gating circuitry into a shift register stage. Shift register 1300 provides the functionality to make an array of memory cells function as a serial memory. Embodiments of the present invention that are configured as a serial memory structure have the advantage of density because of the hybrid static and dynamic design. The static aspect is contained in the conventional latch of the SRAM portion. The dynamic design is based on two storage nodes (i.e., the gates of transistors 1330 and 1331) that temporarily hold adjacent latch data to facilitate the data shift operation. The hold time required for the dynamic node is only the delay between the two clocks—$\phi_1$ and $\phi_2$. This delay may be much less than a microsecond. Therefore the register can shift even at extremely high temperatures, much greater than 125° C. While the latch may be loaded or unloaded serially as set forth above, it is also possible that parallel data output can be made from each stage. Inverters such as 1340 may be added to buffer each latch of each register stage to provide parallel data out bits.

Figure 14:
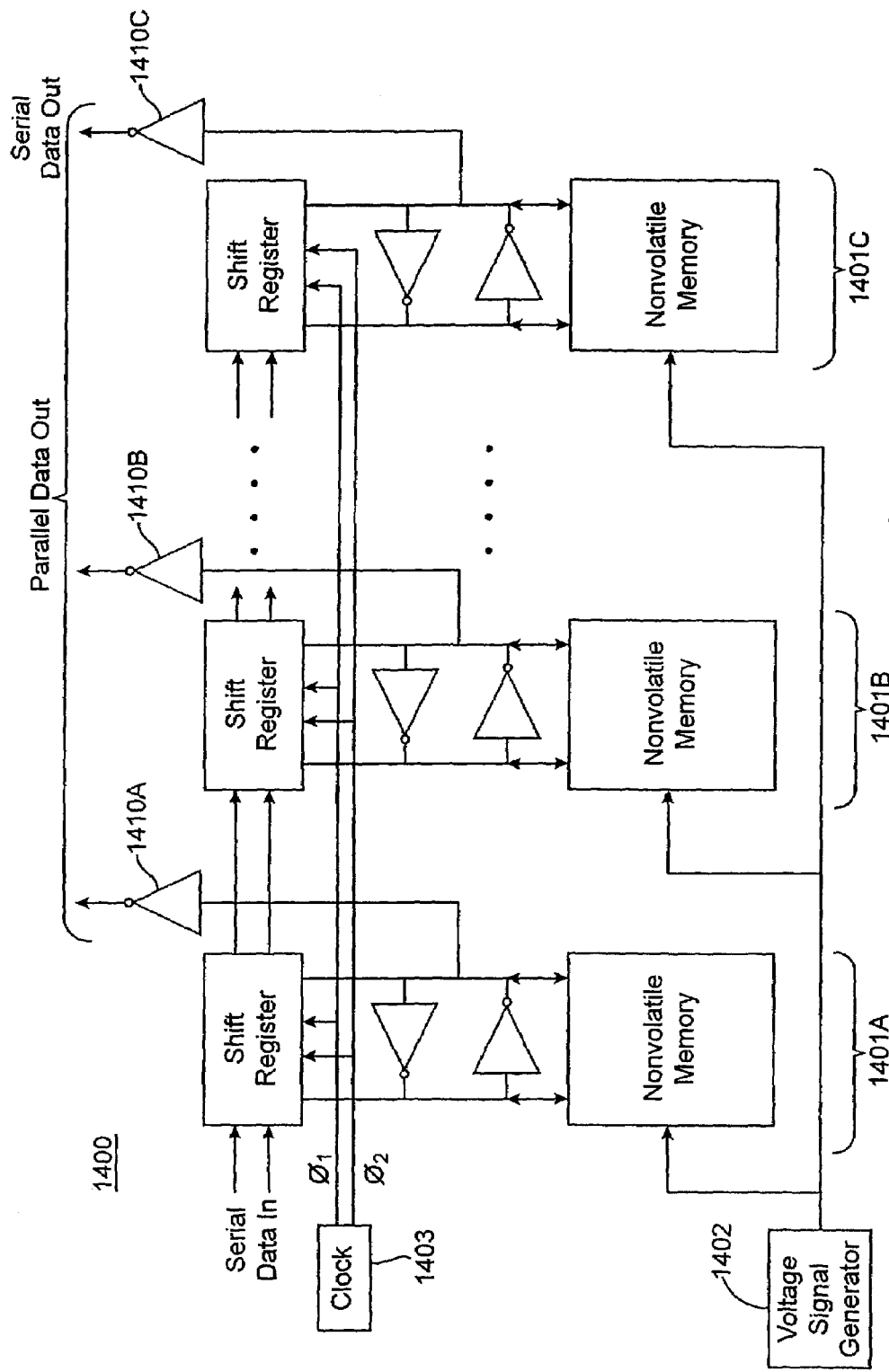
FIG. 14 illustrates an exemplary nonvolatile memory according to one embodiment of the present invention

FIG. 14 illustrates an exemplary nonvolatile memory according to one embodiment of the present invention. Nonvolatile memory 1400 includes a plurality of memory cells 1401 each receiving a voltage signals from voltage signal generator 1402 for generating the voltages used during the operations discussed above, including the two-phase voltage signals used in the programming and erase operations. Clock 1403 may be used to generate a two-phase non-overlapping pulse or clock signal for controlling serial data operations. Finally, embodiments of the present invention may include a plurality of output inverters 1410A–C for providing a parallel data output. In one embodiment, the last parallel data output is also the serial data output.

Having fully described various embodiments of the present invention, other equivalent or alternative methods of implementing a nonvolatile memory according to the present invention will be apparent to those skilled in the art. The invention has been described above by way of illustration, and the specific embodiments disclosed are not intended to limit the invention to any of the particular forms or embodiments disclosed.

What is claimed is:

1. A nonvolatile memory comprising:
a nonvolatile memory element having at least first and second terminals;
a voltage source coupled to at least one terminal to provide a first voltage during a first time period, said first voltage being less tan the voltage required to for electrons to flow to or from a floating gate of the nonvolatile memory element; and
a charge pump circuit coupled to said at least one terminal, the charge pump circuit including at least one capacitor that receives a second voltage during a second time period, and in accordance therewith, further increases the voltage on said terminal so that electrons flow to or from the floating gate of the nonvolatile memory element.

2. The nonvolatile memory of claim 1 further comprising a plurality of transistors coupled to the first terminal, wherein during the second time period one or more of the plurality of transistors receives a third voltage so that the difference between the voltage on the first terminal and the third voltage is less than the breakdown voltage of the one or more transistors.

3. The nonvolatile memory of claim 2 wherein the first terminal, the at least one capacitor, and at least one of the plurality of transistors comprise doped active regions that are coupled together.

4. The nonvolatile memory of claim 1 wherein the floating gate is coupled to the gate of a MOS transistor for generating a current when the floating gate is at a first voltage and turning off said current when the floating gate is at a second voltage.

5. The nonvolatile memory of claim 4 further comprising a latch having a first latch node coupled to said current and a second latch node coupled to a reference current, wherein the latch takes on a first state when said current is greater than said reference current, and said latch takes on a second state when said current is less than said reference current.

6. The nonvolatile memory of claim 1 further comprising a redundant nonvolatile memory element and a redundant charge pump circuit.

7. The nonvolatile memory of claim 1 wherein the nonvolatile memory element and the at least one capacitor comprise doped active regions, an oxide layer, and a polysilicon layer.

8. The nonvolatile memory of claim 1 wherein the nonvolatile memory element comprises a nonvolatile memory device coupled to a capacitor.

9. The nonvolatile memory of claim 8 wherein the nonvolatile memory device is a tunneling capacitor.

10. A nonvolatile memory comprising:
a nonvolatile memory element having at least first and second terminals and a floating gate; and
one or more capacitors coupled in series to the first terminal,
wherein during a first time period, a first voltage is coupled to the first terminal and a second voltage is coupled to the second terminal, the first voltage being greater than the second voltage, and during a second time period following the first time period, a third voltage is coupled trough at least one of the capacitors to the first terminal, the third voltage further increasing the voltage on the first terminal so that electrons flow to or from the floating gate.

11. The nonvolatile memory of claim 10 wherein electrons move from the floating gate to the first terminal to erase the nonvolatile memory element.

12. The nonvolatile memory of claim 10 wherein electrons move from the first terminal to the floating gate to program the nonvolatile memory element.

13. The nonvolatile memory of claim 10 further comprising a plurality of transistors coupled to the first terminal, wherein during the second time period one or more of the plurality of transistors receives a fourth voltage so that the difference between the voltage on the first teal and the fourth voltage is less than the breakdown voltage of the one or more transistors.

14. The nonvolatile memory of claim 13 wherein the first terminal, at least one of said capacitors, and the one or more of the plurality of transistors comprise doped active regions that are coupled together.

15. The nonvolatile memory of claim 10 further comprising a first voltage source that provides the first voltage during the first time period and a second voltage source that provides the third voltage during the second time period following the first time period.

16. The nonvolatile memory of claim 15 wherein the first voltage source increases approximately linearly to the first voltage during the first time period, and the second voltage source increases approximately linearly to the third voltage during the second time period, and in accordance therewith, the voltage on the first terminal of the nonvolatile memory element increases approximately linearly from an initial voltage to an intermediate voltage during the first time period, and increases approximately linearly from the intermediate voltage to a final voltage during the second time period.

17. The nonvolatile memory of claim 10 further comprising first and second voltage sources, the first voltage source providing a two-part voltage signal including the first voltage during the first time period and a fourth voltage during the second time period, and the second voltage source providing a one-part voltage signal during the second time period.

18. The nonvolatile memory of claim 10 wherein the nonvolatile memory element comprises a nonvolatile memory device having a floating gate coupled to a first capacitor.

19. The nonvolatile memory of claim 18 further comprising:
a second capacitor coupled to the first terminal;
a third capacitor coupled between the first and second capacitors;
a first voltage source coupled to the first terminal, the first voltage source providing the first voltage to the first terminal during the first time period; and
a second voltage source coupled to a node between the second and third capacitors, the second voltage source providing the third voltage to the second capacitor during the second time period to further increase the voltage on the first terminal.

20. The nonvolatile memory of claim 19 wherein the first voltage source comprises a first MOS transistor having a gate coupled to a control voltage, a drain coupled to the first, terminal, and a source coupled to a fourth voltage.

21. The nonvolatile memory of claim 20 wherein the first voltage source further comprises a second MOS transistor having a gate coupled to the control voltage, a drain coupled to the first and third capacitors, and a source coupled to receive the second voltage.

22. The nonvolatile memory of claim 21 further comprising a latch having a first latch node coupled to source of the first MOS transistor and a second latch node coupled to the source of the second MOS transistor.

23. The nonvolatile memory of claim 19 wherein the floating gate is coupled to the gate of a MOS transistor for generating a current when the floating gate is at a first voltage and turning off said current when the floating gate is at a second voltage.

24. The nonvolatile memory of claim 23 further comprising a latch having a first latch node coupled to said MOS transistor to receive said current and a second latch node coupled to a reference current, wherein the latch takes on a first state when said current is greater than said reference current, and said latch takes on a second state when said current is less than said reference current.

* * * * *